(12) United States Patent
Elferich et al.

(10) Patent No.: US 11,322,286 B2
(45) Date of Patent: May 3, 2022

(54) SPLIT TRANSFORMER ASSEMBLY

(71) Applicant: SIGNIFY HOLDING B.V., Eindhoven (NL)

(72) Inventors: Reinhold Elferich, Aachen (DE); Ludwig Oostvogels, Nuenen (NL); Petrus Johannes Maria Van Os, Heeswijk (NL); Willem Van Dijk, Delft (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 701 days.

(21) Appl. No.: 16/086,634

(22) PCT Filed: Apr. 7, 2017

(86) PCT No.: PCT/EP2017/058404
§ 371 (c)(1),
(2) Date: Sep. 20, 2018

(87) PCT Pub. No.: WO2017/178374
PCT Pub. Date: Oct. 19, 2017

(65) Prior Publication Data
US 2019/0103210 A1    Apr. 4, 2019

(30) Foreign Application Priority Data

Apr. 14, 2016 (EP) .................... 16165280

(51) Int. Cl.
*H01F 27/06* (2006.01)
*H01F 27/32* (2006.01)
(Continued)

(52) U.S. Cl.
CPC .......... *H01F 27/06* (2013.01); *H01F 27/324* (2013.01); *H05K 1/165* (2013.01); *H01F 2019/085* (2013.01); *H01F 2027/065* (2013.01)

(58) Field of Classification Search
CPC ........ H01F 27/06; H01F 27/324; H05K 1/165
See application file for complete search history.

(56) References Cited

U.S. PATENT DOCUMENTS 4,103,268 A * 7/1978 Anders ................. H01F 5/02
                                                  336/208
5,565,837 A   10/1996 Godek et al.
(Continued)

FOREIGN PATENT DOCUMENTS

CN    101651008 A    2/2010
CN    104425117 A    3/2015
(Continued)

*Primary Examiner* — Elvin G Enad
*Assistant Examiner* — Malcolm Barnes
(74) *Attorney, Agent, or Firm* — Daniel J. Piotrowski

(57) ABSTRACT

The invention describes a split transformer assembly (1) comprising a first partial assembly (10) comprising a primary winding arrangement (10W) shaped to accommodate a first core half (10C); a second partial assembly (20) comprising a secondary winding arrangement (20W) shaped to accommodate a second core half (20C); and wherein the first partial assembly (10) is realized for mounting on one side of a circuit board (3) and the second partial assembly (20) is realized for mounting on the opposite side of the circuit board (3) such that the core halves (10C, 20C) of the partial assemblies (10, 20) are completely isolated by the material of the circuit board (3). The invention further describes a switching converter circuit arrangement (2), and a method of assembling a split transformer (1).

13 Claims, 5 Drawing Sheets

(51) Int. Cl.
*H05K 1/16* (2006.01)
*H01F 19/08* (2006.01)

(56) References Cited

U.S. PATENT DOCUMENTS

| | | | |
|---|---|---|---|
| 6,529,389 | B2 | 3/2003 | Perlick et al. |
| 6,734,775 | B2 | 5/2004 | Chung |
| 7,477,120 | B2 | 1/2009 | Gu et al. |
| 8,648,687 | B2 | 2/2014 | Li et al. |
| 9,433,043 | B1 | 8/2016 | Hanz |
| 2001/0022548 | A1* | 9/2001 | Hasler .................. H01F 27/324 336/196 |
| 2003/0030534 | A1* | 2/2003 | Gu ...................... H01F 27/2885 336/221 |
| 2003/0201863 | A1* | 10/2003 | Chung ................. H01F 27/324 336/200 |
| 2007/0202727 | A1* | 8/2007 | Feist .................... H01F 27/027 439/246 |
| 2010/0219926 | A1 | 9/2010 | Willers et al. |
| 2012/0154095 | A1* | 6/2012 | Li .......................... H01F 27/06 336/199 |
| 2013/0328655 | A1* | 12/2013 | Catalano ................ H01F 5/003 336/200 |
| 2015/0061805 | A1* | 3/2015 | Eom .................... H01F 27/2804 336/65 |

FOREIGN PATENT DOCUMENTS

| | | | | |
|---|---|---|---|---|
| CN | 204270848 | U | 4/2015 | |
| CN | 105448507 | A | 3/2016 | |
| DE | 19615921 | A1 * | 10/1997 | ......... H01F 17/0033 |
| DE | 102013007850 | A1 * | 11/2014 | ........... H01F 17/043 |
| EP | 352592 | A1 | 1/1990 | |
| EP | 0961303 | A2 | 12/1999 | |
| GB | 2252208 | A | 7/1992 | |
| GB | 2489532 | A | 10/2012 | |
| JP | 63084106 | A | 4/1988 | |
| WO | 0122445 | A1 | 3/2001 | |
| WO | WO-2011154993 | A1 * | 12/2011 | ........... H01F 27/306 |
| WO | 2012131350 | A3 | 11/2012 | |

* cited by examiner

SPLIT TRANSFORMER ASSEMBLY

CROSS-REFERENCE TO PRIOR APPLICATIONS

This application is the U.S. National Phase application under 35 U.S.C. § 371 of International Application No. PCT/EP2017/058404, filed on Apr. 7, 2017 which claims the benefit of European Patent Application No. 16165280.5, filed on Apr. 14, 2016. These applications are hereby incorporated by reference herein.

FIELD OF THE INVENTION

The invention describes a split transformer assembly, a switching converter circuit, and a method of manufacturing a split transformer assembly.

BACKGROUND OF THE INVENTION

An isolating transformer can be used in an application that electrically isolates an end device from the power supply (e.g. the mains power supply). Such a transformer generally comprises a primary winding, a secondary winding, and a core to magnetically couple the two windings. The transformer is generally located on a printed circuit board carrying other circuit components. To ensure device safety, certain regulations must be satisfied. For example, the IEC 61558-1 regulation specifies minimum distances for creepage and clearance for the windings, terminals and core of an isolating transformer. Creepage is the shortest path between two conductive parts (or between a conductive part and the bounding surface of the equipment) measured along the surface of the insulation. For example, creepage and clearance distances may be specified as winding-to-winding distances, terminal-to-terminal distances, core-to-terminal distances, etc. A proper and adequate creepage distance protects against tracking, a process that produces a partially conducting path of localized deterioration on the surface of an insulating material as a result of the electric discharges on or close to an insulation surface. The degree of tracking required depends on two major factors: the comparative tracking index (CTI) of the material and the degree of pollution in the environment. Used for electrical insulating materials, the CTI provides a numerical value of the voltage that will cause failure by tracking during standard testing. Tracking can lead to damage of the insulating material because of humidity, the presence of contamination, corrosive substances, etc. Electrical isolation between the primary and secondary sides of an isolating transformer can be ensured by using triple insulated wire, which can reduce the winding-to-winding creepage and clearance distances to almost zero. However, a disadvantage of using triple insulated wire is the added cost and problems associated with its availability. In any case, the creepage and clearance requirements will still apply to any terminal-to-core distance, i.e. the distance between the core and any conductor on the circuit board. This is because a core is regarded as a conductive component, and any electrical connectors on the circuit board must maintain a minimum distance to the core.

One way of dealing with these requirements is to employ a "split bobbin" configuration, with a coil-former and cover combination. The split-bobbin design does not require triple insulated wire to comply with the winding-to-winding distances. However, this design cannot reduce the terminal-to-core creepage/clearance distances, so that a split-bobbin design extends unfavourably far outward from the board. A split bobbin design is difficult to miniaturize, since the coil-former and cover combination reduces the device size only on three sides.

GB2252208A discloses a integrated circuit planar transformer, two core halves of the transformer is placed at opposite side of a PCB, and the PCB has through hole to allow the two core halves abut each other. FIG. 9 shows a structure similar as GB2252208A.

In effect, the creepage and clearance regulations for transformers with safety isolation put a limit on the minimum package size, even if triple-insulated wire is used. These distances reduce the effective volume available for the winding (and therefore places a limit on the number of turns and/or the wire cross-section area) and also increase the volume required for the soft magnetic core and the effective length of the magnetic path.

Therefore, it is an object of the invention to provide a transformer assembly that overcomes the problems described above.

SUMMARY OF THE INVENTION

According to the invention, the split transformer assembly comprises a circuit board; a first partial assembly comprising a primary winding arrangement shaped to accommodate a first core half; a second partial assembly comprising a secondary winding arrangement shaped to accommodate a second core half; and a transformer core comprising the first core half and the second core half. The first partial assembly is realized for mounting on one side of the circuit board and the second partial assembly is realized for mounting on the opposite side of the circuit board such that, when assembled, the transformer core halves (each contained in a partial assembly) are completely isolated by the material of the circuit board. The primary winding arrangement and first core half of the first partial assembly are spatially and electrically separate from the secondary winding arrangement and second core half of the second partial assembly.

A "winding" in the context of the invention is a coil of wire, usually a copper wire. The wire can have a suitable thickness, and the winding or coil can have a suitable number of turns. A "winding arrangement" in the context of the invention can comprise one or more separate windings in a physical package that is mounted onto or attached to one side of the circuit board. A transformer core is generally made of a soft magnetic material such as a ferrite. In a low-inductance realisation, the core might simply comprise air. In the following, but without restricting the invention in any way, it may be assumed that the core is a solid component made of a suitable ferrite. In the context of the invention, the first core half extends into the space defined by the primary winding arrangement, and the second core half extends into the space defined by the secondary winding arrangement. The core does not extend through an opening or cut-out in the PCB as known from the prior art. Instead, a layer of the circuit board material separates the two halves of the core. In the inventive split transformer assembly, therefore, the printed circuit board serves as the separator between the core halves, and therefore as the isolation between the mains side of the transformer and the load side. An advantage of the inventive split transformer configuration is that its construction ensures isolation of the primary winding from the secondary winding, and also ensures isolation of the primary core half from the secondary core half, thus eliminating the need for a winding-to-winding safety distance and a terminal-to-terminal safety distance. For these reasons, the inventive split transformer assembly can have a favourably miniaturized form, and is particularly well suited as a component of a resonant converter. The inventive split transformer assembly can be realized for use in a power range extending from a few Watts to a several kilowatts.

According to the invention, the switching converter circuit arrangement comprises a circuit board provided with conductive leads for electrically connecting a number of circuit components, and wherein a region on each side of the circuit board serves as a mounting region to receive a partial assembly. In the context of the invention, the mounting region is a physical part of the board and comprises an uninterrupted stretch of the circuit board. In other words, the region of the circuit board that carries the transformer assembly is free of any through-openings. This is in contrast to comparable prior art constructions in which an opening is formed in the circuit board to allow a transformer core to extend through the opening.

An advantage of the inventive switching converter circuit arrangement is that the overall dimensions can be "shrunk", since the inventive split transformer assembly can be significantly smaller than a comparable prior art transformer assembly. In this way, for example, a resonant converter can be realised in a favourably miniaturized fashion.

According to the invention, the method of assembling a split transformer comprises the steps of providing a first partial assembly by forming a primary winding arrangement to accommodate a first core half; providing a second partial assembly by forming a secondary winding arrangement to accommodate a second core half; and subsequently mounting the first partial assembly on a mounting region on a first side of a circuit board and mounting the second partial assembly on a mounting region on the opposite side of a circuit board such that the core halves are separated by the material of the circuit board.

An advantage of the inventive method is that the creepage and clearance regulations can easily be complied with, even when the split transformer assembly is constructed in a miniaturized fashion. Furthermore, it is relatively straightforward to provide the first and second partial assemblies, so that the inventive split transformer can be manufactured at favourably low cost. The resulting split transformer assembly can be constructed in such a way to have a favourably small footprint and a favourably low height outward from the printed circuit board.

The dependent claims and the following description disclose particularly advantageous embodiments and features of the invention. Features of the embodiments may be combined as appropriate. Features described in the context of one claim category can apply equally to another claim category.

In the following, but without restricting the invention in any way, the expressions "first core half" and "primary core half" may be used interchangeably. The same applies for the expressions "second core half" and "secondary core half". The terms "circuit board", "board", "printed circuit board", and "PCB" may be used interchangeably.

The split transformer assembly is mounted to the PCB by attaching the first partial assembly to one side of the board, and by attaching the second partial assembly to the opposite side of the board. In a preferred embodiment of the invention, therefore, the mounting region comprises a first mounting region on a first side of the circuit board for receiving the first partial assembly; and a second mounting region on the opposite side of the circuit board for receiving the second partial assembly. Each mounting region may comprise dedicated conductive areas applied in an appropriate pattern for connection to the terminals or ends of the primary and secondary windings.

A winding arrangement of the inventive transformer may be self-supporting, i.e. one or more windings can be brought into the desired shape and then held in form by a suitable coating material. In a further preferred embodiment of the invention, at least one of the partial assemblies comprises a coil former shaped to carry the winding arrangement of that partial assembly and to accommodate the core half of that partial assembly. In a particularly preferred embodiment of the invention, the primary winding of the first partial assembly is arranged around a primary coil former, and the secondary winding of the second partial assembly is arranged around a secondary coil former. Preferably, the coil formers comprise complementary shapes.

In a further embodiment, the material of the circuit board is adapted to separate the core halves throughout a whole area of the core halves and to provide an air gap for the core halves.

Generally, a PCB will have a uniform thickness throughout, for example a nominal thickness of 1.0 mm, a nominal thickness of 1.6 mm, etc. In one embodiment of the invention, therefore, the isolating layer between the core halves will have the thickness of the PCB. The transformer design may be adapted to suit this isolating layer or "board-gap" thickness. However, an unnecessarily large distance between the core halves may result in unwanted stress on the windings. For example, the windings may overheat as a result and/or there may be an unfavourably high leakage and/or insufficient coupling between the primary and secondary windings. A preferred embodiment of the invention is based on the insight that an effective isolation between the core halves can be achieved with less material, which benefits the windings also. In this preferred embodiment, the circuit board thickness in the mounting region is less than the nominal circuit board thickness. Throughout experiments with the inventive split transformer assembly, a thickness of 0.5 mm has been observed to provide sufficient isolation while ensuring satisfactory performance of the split transformer.

The decreased thickness in the mounting region can be achieved in any number of ways. A PCB may be made of a layered construction of two or more laminated layers, wherein for example one such inner layer comprises an uninterrupted plane over its entire extent including the mounting region(s), while a further outer layer comprises a cut-out to expose a mounting region. However, in a particularly preferred embodiment of the invention, the decreased thickness in the mounting region can be achieved by reducing the thickness of the circuit board in the first mounting region and/or in the second mounting region, for example by applying an appropriate subtractive technique such as milling. Material can be removed from one side only, or from both sides, as appropriate.

The windings of the transformer assembly must be connected in some way to the rest of the circuit. Therefore, in a preferred embodiment of the invention, the switching converter circuit arrangement comprises a connector arrangement for electrically connecting a winding to a conductive lead on the circuit board. Preferably, the connector arrangement comprises at least one winding connector pin arranged for connection to a winding terminal and at least one lead connector pin arranged for connection to a conductive lead on the circuit board. A winding connector pin can be electrically connected to a lead connector pin through the body of the coil former. The required minimum distance between a winding connector pin and a lead connector pin can easily be complied with.

In a particularly preferred embodiment of the invention, the connector arrangement comprises a first portion, a second portion, and a hinge between the first portion and a second portion. In this preferred embodiment, the hinge allows the second portion to be folded in the direction of the coil former, thereby making an even more compact realisation possible. To this end, the first portion is formed as part of a coil former and the second portion bears the connector pins. Initially, the connector arrangement can be "open", so that the windings can be arranged on the coil former. After completion of the winding procedure, the second portion can be folded inward. This type of embodiment is particularly suited to a transformer assembly which comprises a coil former with a winding separator between separate and adjacent windings. Such an embodiment is generally preferred in order to reduce or eliminate parasitic capacitance of a winding. In this case, the terminals of the winding arrangement can be arranged to exit the coil former at the level of the winding separator. This permits an even more compact realization of the inventive transformer assembly, since the base of the coil former (i.e. the end that is secured to the PCB) can be thinner that in the case of a comparable transformer without such a two-part connector, and the assembly can have a smaller height. This will be explained later with the aid of the drawings.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
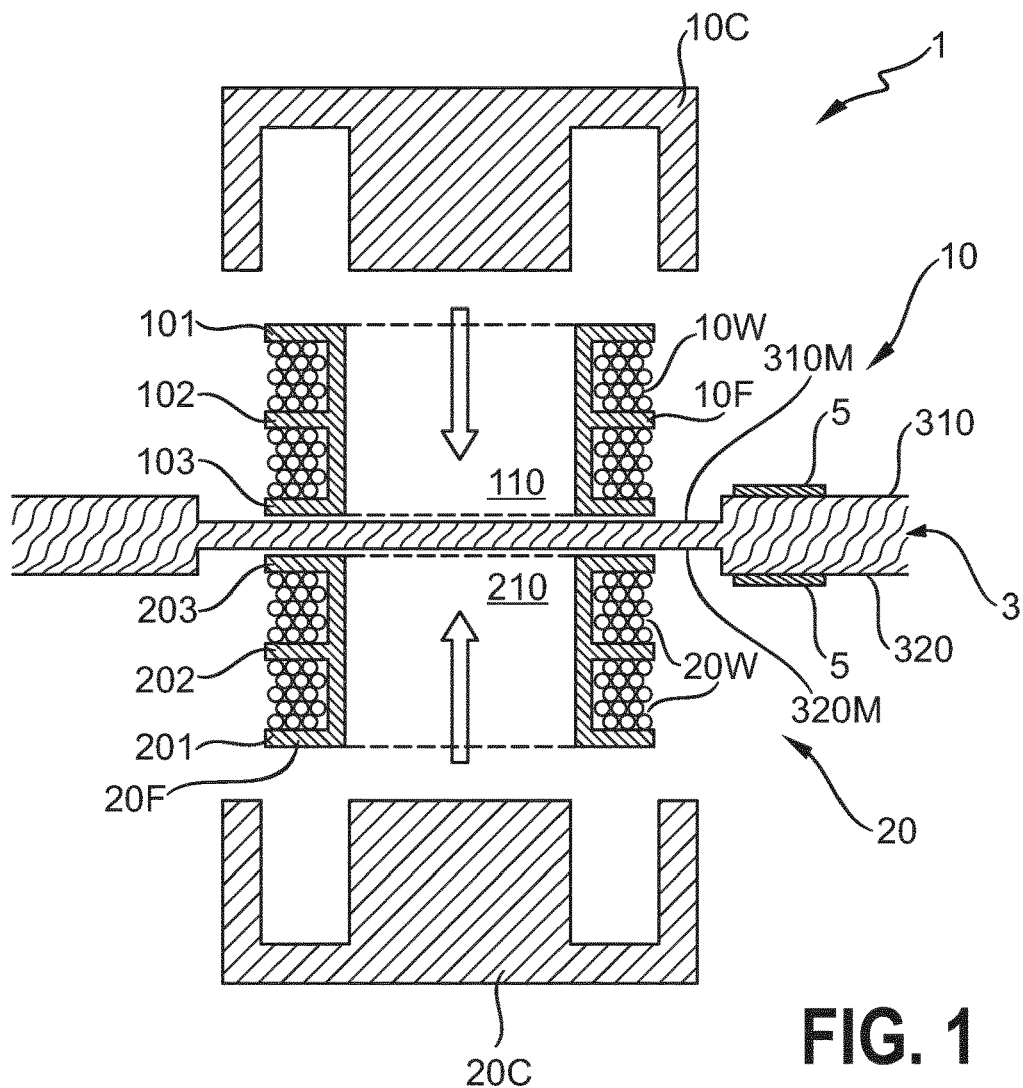
FIG. 1 shows a first embodiment of the split transformer assembly according to the invention.

FIG. 1 shows a first embodiment of the inventive split transformer assembly 1. The main parts of the split transformer assembly 1 are the first partial assembly 10 comprising a primary coil former 10F, a primary winding arrangement 10W and a primary core half 10C; the second partial assembly 20 comprising a secondary coil former 20F, a secondary winding arrangement 20W and a secondary core half 20C. In this exemplary embodiment, the coil formers 10F, 20F are essentially identical in shape and size, and the same applies to the core halves 10C, 20C. Of course, the coil formers (and core halves) could have different dimensions if necessary. In this example, the primary coil former 10F has an inner annular bound 103, an intermediate annular bound 102 and an outer annular bound 101 to define a separate annular compartment for two sections of the primary winding 10W when realised as a slotted winding. Similarly, the secondary coil former 20F has an inner annular bound 203, an intermediate annular bound 202 and an outer annular bound 201 to define a separate annular compartment for sections of the slotted secondary winding 20W. Each coil former 10F, 20F has an essentially hollow annular shape, open at both ends and defining a cavity 110, 210 which will accommodate at least part of a core half 10C, 20C. In this exemplary embodiment, a core half 10C, 20C is realised to have an E-shape in cross-section, so that a core half 10C, 20C is shaped to fit around and inside its coil former 10F, 20F, i.e. a core half 10C, 20C encloses and fills its coil former 10F, 20F. This type of core shape will be known to the skilled person.

The diagram shows that the first partial assembly 10 and the second partial assembly 20 are mounted on opposite faces 310, 320 of a PCB 3. This can be done using any suitable technique, for example the partial assemblies 10, 20 can be soldered onto the circuit board in a surface-mount process. For example, solder pads may be deposited on the PCB in a prior step, so that attachment of the partial assemblies 10, 20 can be done in a reflow step.

Figure 2:
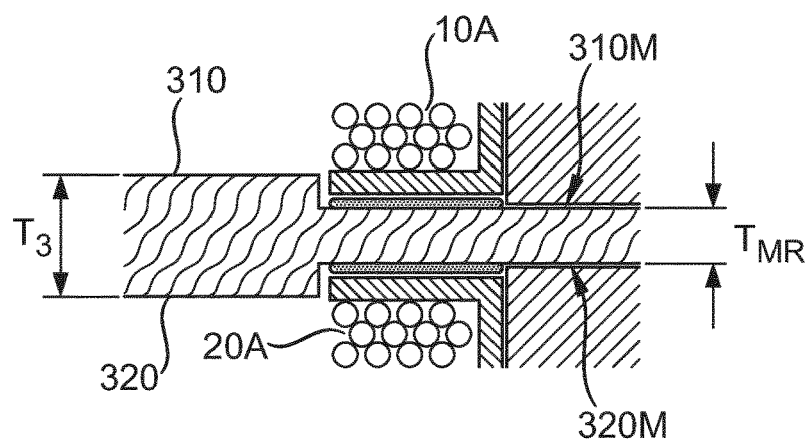
FIG. 2 shows a detail of the split transformer assembly of FIG. 1.

The diagram also clearly shows that the core halves 10C, 20C are separated by a layer of the PCB material. FIG. 2 shows a close-up of the partial assemblies 10, 20 mounted to the PCB 3, showing that the PCB 3 has been locally thinned. The nominal or initial thickness $T_3$ of the PCB 3 can be in the usual range of 0.5 mm to 1.6 mm, while the mounting region thickness $T_{MR}$ is only 0.2 mm-1.0 mm in height. Besides assisting in the alignment of the partial assemblies 10, 20 during a soldering step, the locally thinner mounting region 310M, 320M ensures a favourably short distance $T_{MR}$ through the insulating material between the primary core half 10C and the secondary core half 20C. A minimum DTI requirement (distance through insulation requirement as specified in IEC 61558-1, edition 2005, table D1, appendix D) may present a limit to the minimum possible PCB thickness in the mounting region 310M, 320M, since the PCB material is effectively the insulation between the primary and secondary windings 10W, 20W closest to the board 3. The thickness may depend for example on the power rating of the application, for example a 300 $V_{rms}$ application may require an insulation thickness of at least 0.5 mm which, in the case of the inventive transformer assembly, corresponds to the mounting region PCB thickness $T_{MR}$.

Figure 3:
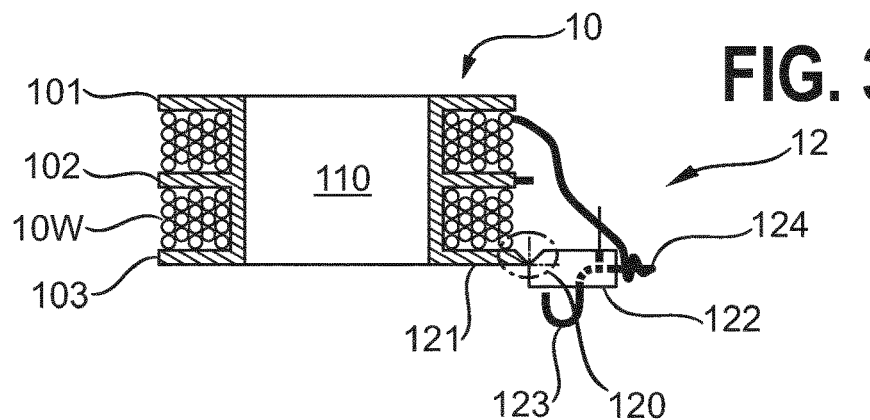
FIG. 3 shows a further detail of the split transformer assembly of FIG. 1.
Figure 4:
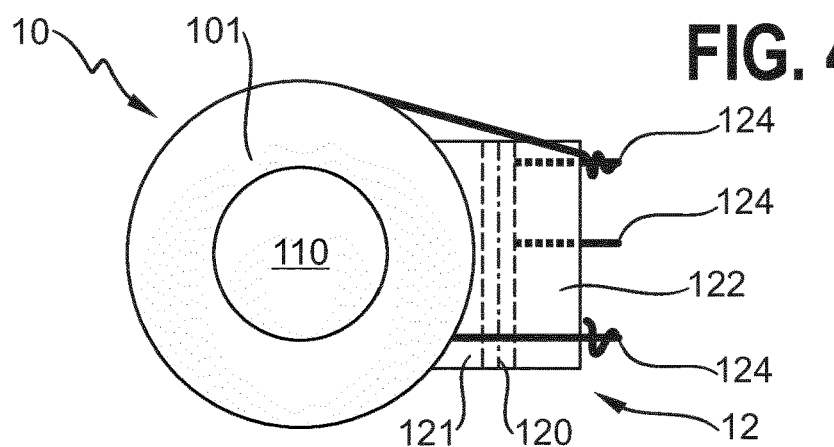
FIG. 4 shows a plan view of the split transformer assembly of FIG. 1.

In FIGS. 1 and 2, the windings 10W, 20W of the split transformer assembly 1 have not yet been connected to the remainder of the circuit, and a connecting means was not included in the diagram for reasons of clarity. FIGS. 3 and 4 show a preferred way of providing connectors for the transformer windings 10W, 20W to conductive leads 5 or contacts 5 previously printed on the PCB. The diagram shows a hinged connector 12. A first portion 121 of the hinged connector extends from the inner annular bound 103 of the primary coil former 10F. A second portion 122 is connected by means of a hinge 120 to the first portion 121.

Figure 5:
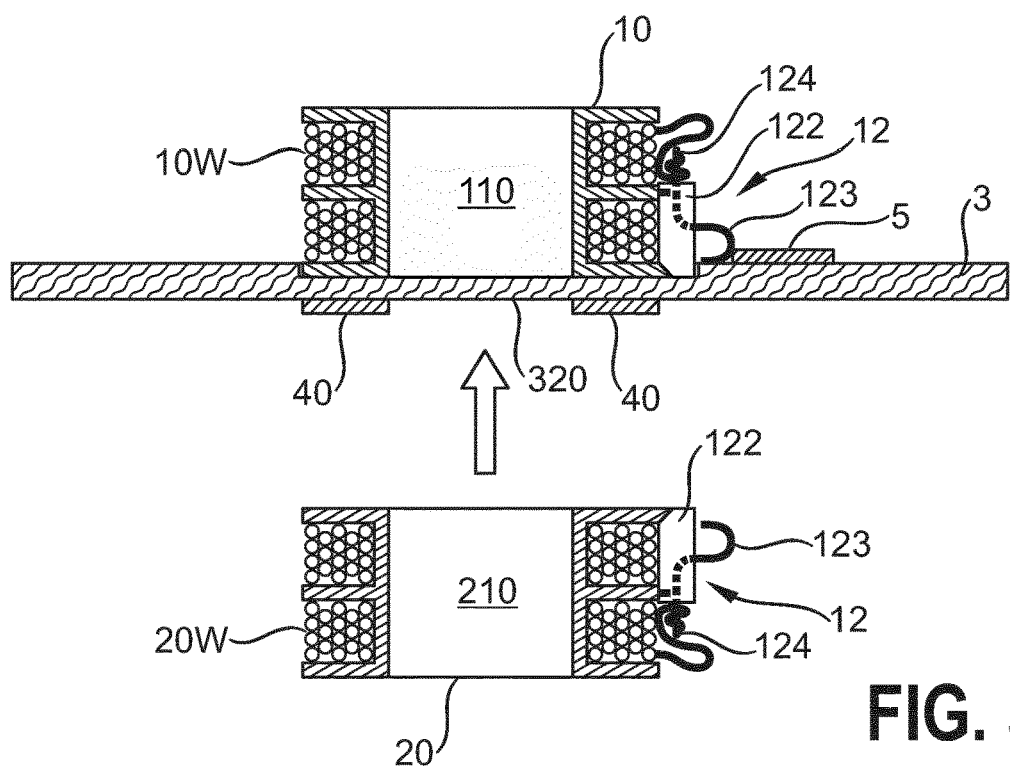
FIG. 5 shows a second embodiment of the split transformer assembly according to the invention.

One end of the primary winding 10W leaves the coil former 10F at the level of the inner annular bound103. The other end of the primary winding 10W leaves the coil former 10F at the level of the outer annular bound 101. The diagrams show the connector 12 in its open position, allowing the windings 10W to be wrapped around the coil former 10F. FIG. 5 shows the connector 12 in its closed position, i.e. with the second portion 122 flipped or bent upwards. The second portion 122 is shown to lie closely against the filled coil former 10F in a favourably compact manner. The second portion 122 comprises two winding connector pins 124, each of which is connected electrically (as indicated by the dotted lines) to a lead connector 123 on the underside of the second portion 122. When the second portion 122 is flipped closed, the lead connectors 123 make robust electrical connections between the winding terminals and corresponding connectors 50 on the PCB. This completed first partial assembly 10 is then mounted to the PCB 3. FIG. 5 shows the first partial assembly 10 in place on the upper side 310 of the PCB, and the second partial assembly 20 ready for connection to the lower side 320 of the PCB, for example by means of prepared solder pads in the mounting region 320M. In this embodiment, the mounting region 310M comprises a locally thinned area on the upper side 310 of the PCB 3.

Figure 6:
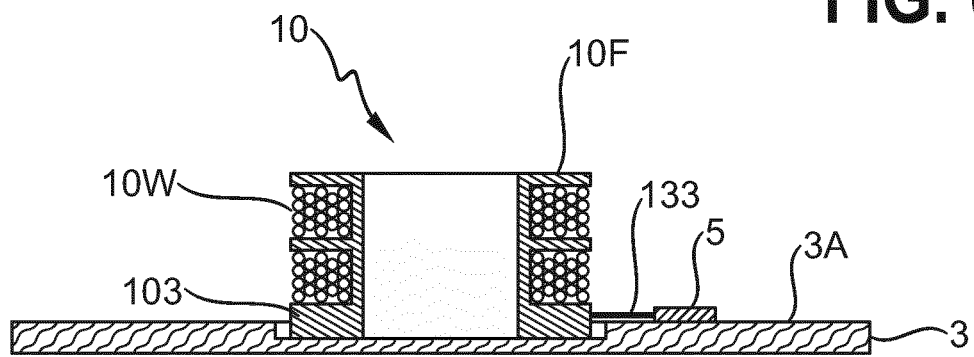
FIG. 6 shows a detail of the split transformer assembly of FIG. 5.
Figure 7:
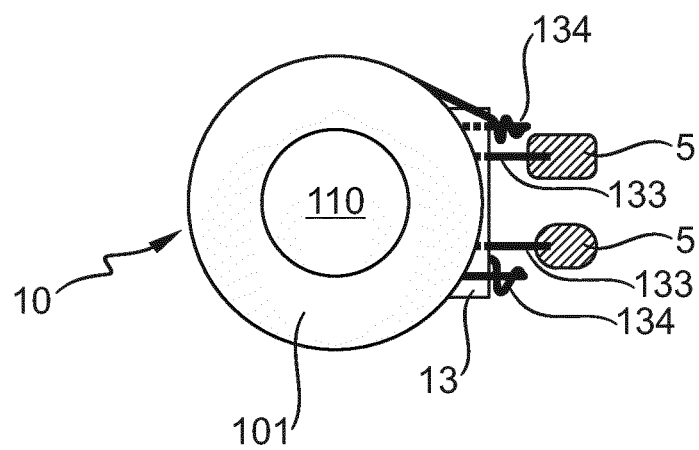
FIG. 7 shows a plan view of the split transformer assembly of FIG. 5.

FIGS. 6 and 7 show an embodiment in which the winding terminals are soldered onto the respective PCB contacts 5. An electrical connection must be made between each terminal of the primary winding 10W and corresponding contacts 5 previously formed on a surface 3A of the PCB 3. Preferably, each partial transformer assembly half (i.e. the primary and secondary partial assemblies) is manufactured in advance so that it can simply be mounted onto the PCB in a SMD soldering procedure. To this end, when the first partial assembly 10 is being manufactured, the ends of the windings 10W are electrically connected to SMD connecting pins 133 by means of pins 134 on a connector block 13 and a through connection (indicated by the dotted line), realized at the level of the inner annular bound 103. FIG. 7 shows a plan view of the coil former 10F and windings 10W of FIG. 6, showing how the end portions of the windings 10W are connected to the mounting pins 134 and to the SMD connector pins 133 through the connector block 13. The inner annular bound 103 requires a certain thickness in order to accommodate a required minimum thickness of a connecting pin 134, so that the overall height of the assembly cannot be as compact as the embodiment explained in FIGS. 1-4 above.

Figure 8:
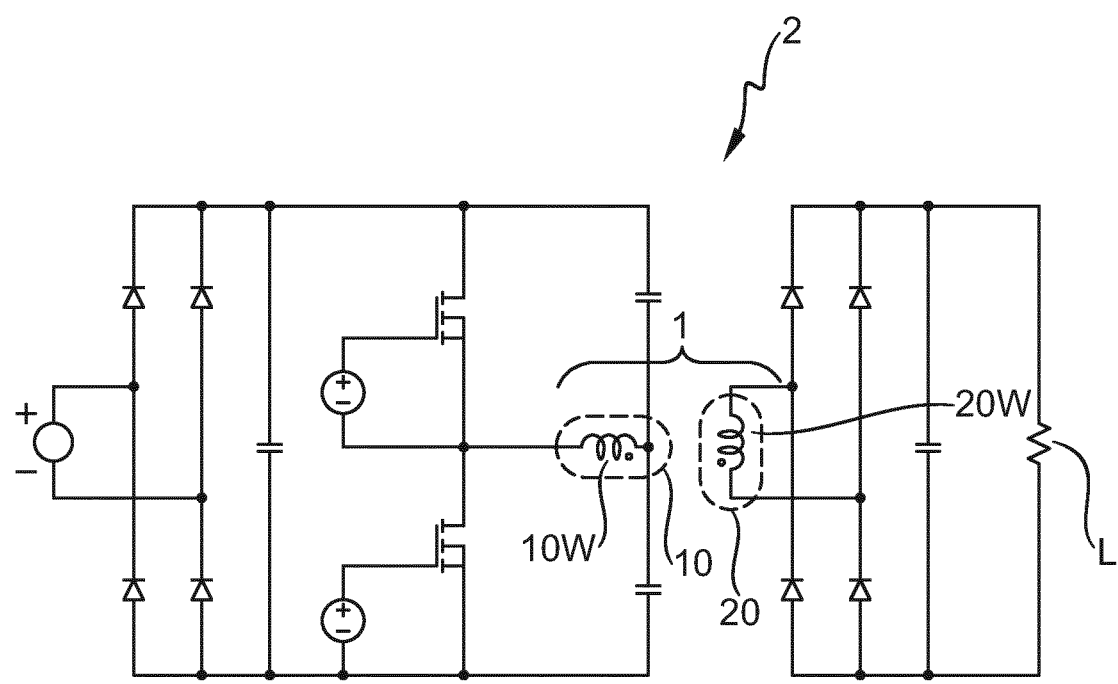
FIG. 8 shows a circuit diagram of an embodiment of the switching converter circuit arrangement according to the invention.

FIG. 8 shows a circuit diagram of an embodiment of the inventive switching converter circuit 2, which includes a split transformer assembly 1 as part of an LLC resonant converter. The transformer assembly 1 may be understood to comprise leakage, as will be known to the skilled person, even though the diagram does not explicitly show a corresponding inductor in series with each of the primary and secondary windings. Equally, the transformer assembly 1 may be assumed to have a non-unity coupling factor. In this embodiment, the inventive transformer assembly 1 is an isolating transformer with its first partial assembly 10 associated with a high-voltage side (on the left of the transformer in the diagram) and with its second partial assembly associated with a low-voltage side (on the right of the transformer in the diagram). This diagram is exemplary for any application requiring an isolation transformer with non-unity coupling and power ratings in the range up to several kilowatts, and for which miniaturization is a priority on account of a small device size. An example of such an application might be a driver of an LED lamp, a mobile device charger, a laptop adapter etc.

Figure 9:
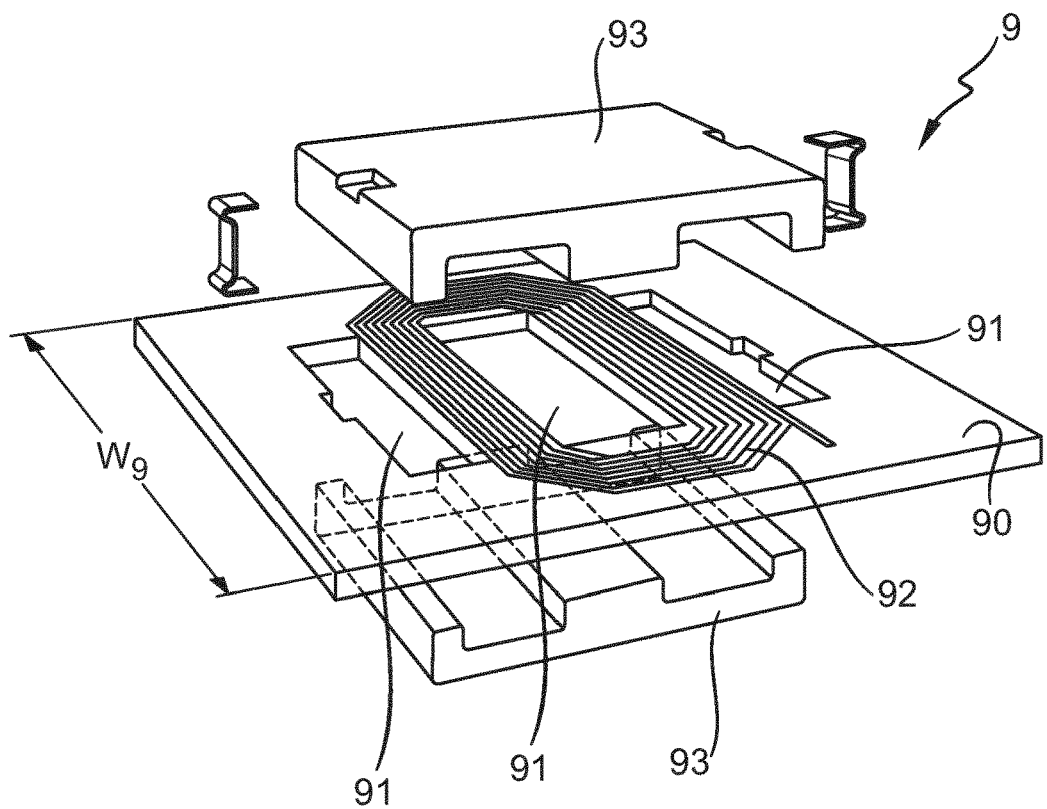
FIG. 9 shows a prior art transformer assembly.

FIG. 9 shows a prior art transformer assembly 9. Here, windings 92 are printed onto a PCB 90, and openings 91 have been formed in the PCB 90 so that ferrite core halves 92 can extend through the openings 91. This type of realisation can be realized with a low overall height, but the overall width $W_9$ is relatively large on account of the flat printed windings 92 and because of the minimum distances for clearance and creepage that must be complied with.

Figure 10:
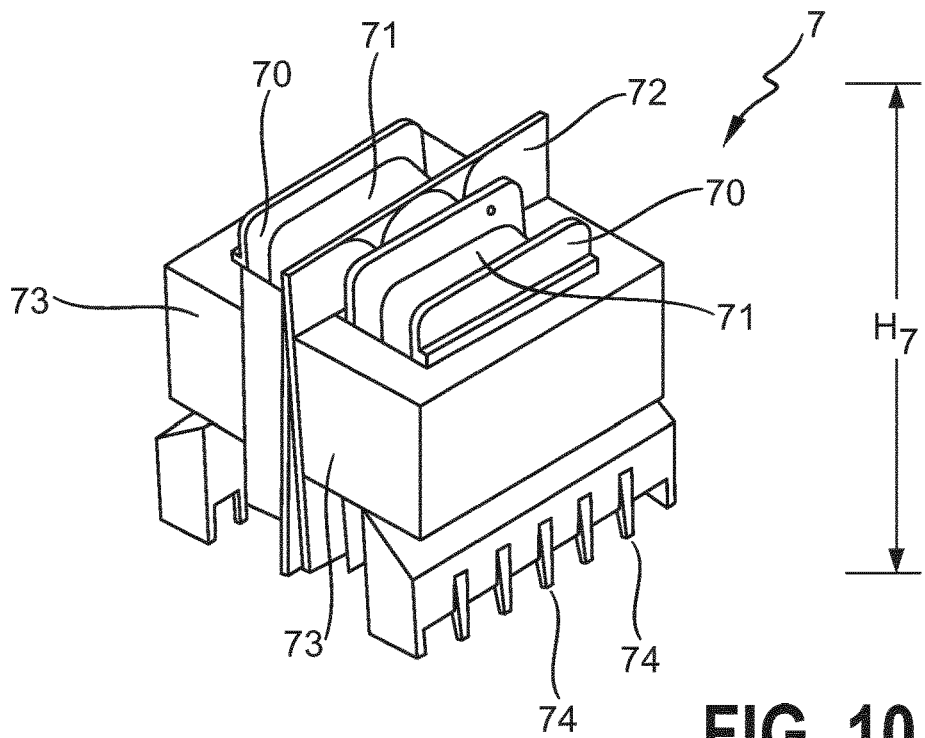
FIG. 10 shows a prior art transformer assembly.

FIG. 10 shows another prior art transformer assembly 7. Here, a split bobbin design is used, with two separate bobbin halves 70, each carrying a winding 71, and an additional isolating separator 72 between the bobbin halves in order to meet the winding-to-winding creepage and clearance distances. The central portion of a ferrite E-core 73 extends into a cavity formed by the bobbin halves 70, and connector pins 74 allow the transformer assembly 7 to be connected to a PCB. Here also, the necessity of fulfilling the terminal-to-core creepage/clearance distance requirements results in an unfavourably large realization, primarily on account of the relatively great height $H_7$. For an exemplary miniaturized driver application with a power rating of 100 W, reinforced insulation, an rms voltage less than 500 V, coil-former materials with a tracking index above 600 V, pollution degree 2 and over-voltage category 2, applying the IEC 61558-1 (2005 edition) yields minimum distances of 5.0 mm for creepage and 4.7 mm for clearance when magnet wire is used for the windings. Furthermore, the minimum distances between non-isolated parts (solder joins/terminals) and isolated parts are 7.2 mm for creepage and 7.2 mm for clearance. These required distances reduce the effective volume available for the windings, increase the dimensions of the soft magnetic core and also increase the effective length of the magnetic path. For these reasons, a prior art transformer assembly will be larger than a comparable split transformer assembly according to the invention, i.e. a transformer assembly having the same rating and functions.

Although the present invention has been disclosed in the form of preferred embodiments and variations thereon, it will be understood that numerous additional modifications and variations could be made thereto without departing from the scope of the invention. As indicated above, the split transformer assembly could be realised as an air core device. Equally, instead of using coil formers, the windings may be self-supporting windings enclosed in a suitable coating material that imparts stability to the winding package.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A split transformer assembly comprising
    a circuit board;
    a first partial assembly comprising a primary winding arrangement shaped to accommodate a first core half;
    a second partial assembly comprising a secondary winding arrangement shaped to accommodate a second core half;
    and wherein the first partial assembly is realized for mounting on one side of the circuit board and the second partial assembly is realized for mounting on the opposite side of the circuit board such that, when mounted on the circuit board, the core halves of the partial assemblies are completely isolated by the material of the circuit board;

a connector arrangement for electrically connecting a winding to a contact on the circuit board, the connector arrangement comprises a first portion connected to a second portion, such that the connector arrangement has an open position and a closed position relative to a coil former, using the first and second portions.

2. A split transformer assembly according to claim 1, wherein at least one of the first and second partial assemblies comprises a coil former shaped to carry the winding arrangement of that partial assembly and to accommodate the core half of that partial assembly, and the material of the circuit board is adapted to separate the core halves throughout a whole area of the core halves and to provide an air gap for the core halves.

3. A split transformer assembly according to claim 1 wherein the connector arrangement comprises at least one winding connector pin arranged for connection to a winding and at least one lead connector pin arranged for connection to a contact on the circuit board.

4. A split transformer assembly according to claim 1, wherein the connector arrangement comprises a solder contact for establishing an electrical connection between a winding and a contact of the circuit board.

5. A split transformer assembly according to claim 1, wherein the connector arrangement includes a hinge between the first portion and the second portion.

6. A split transformer assembly according to claim 5, wherein the connector pins are arranged on the second portion.

7. A split transformer assembly according to claim 5, comprising a solder contact on the underside of the second portion arranged to form an electrical connection to a contact on the circuit board.

8. A switching converter circuit arrangement comprising a split transformer assembly according to claim 1, wherein the circuit board is provided with conductive leads for electrically connecting a number of circuit components, and provided with a mounting region to receive the first and the second partial assemblies of the split transformer assembly.

9. A switching converter circuit arrangement according to claim 8, wherein the mounting region comprises a first mounting region on a first side of the circuit board for receiving the primary winding arrangement; and/or a second mounting region on the opposite side of the circuit board for receiving the secondary winding arrangement.

10. A switching converter circuit arrangement according to claim 8, wherein the circuit board comprises a nominal thickness ($T_3$), and wherein the circuit board thickness ($T_{MR}$) in the mounting region is less than the nominal thickness ($T_3$).

11. A switching converter circuit arrangement according to claim 8, wherein the first mounting region comprises a recess formed in the first side of the circuit board and/or the second mounting region comprises a recess formed in the second side of the circuit board.

12. A switching converter circuit arrangement according to claim 8, wherein the split transformer assembly is realized as a component of a lamp driver, and wherein the material thickness ($T_{MR}$) of the circuit board comprises at most 0.5 mm in the mounting region.

13. A method of assembling a split transformer, comprising the steps of providing a primary winding arrangement;

inserting a first core half into the primary winding arrangement to give a first partial assembly;

providing a secondary winding arrangement;

inserting a second core half into the secondary winding arrangement to give a second partial assembly;

mounting the first partial assembly on a mounting region on a first side of a circuit board and mounting the second partial assembly on a mounting region on the opposite side of a circuit board such that, when mounted on the circuit board, the core halves of the partial assemblies are completely isolated by the material of the circuit board; and mounting a winding arrangement into a recessed region in the circuit board.

* * * * *